(12) United States Patent
Hsu et al.

(10) Patent No.: US 10,134,690 B2
(45) Date of Patent: Nov. 20, 2018

(54) FLOATING PACKAGE STIFFENER

(71) Applicant: Intel Corporation, Santa Clara, CA (US)

(72) Inventors: Hao-Han Hsu, Portland, OR (US); Ying Ern Ho, Bayan Lepas (MY); Jaejin Lee, Beaverton, OR (US)

(73) Assignee: INTEL CORPORATION, Santa Clara, CA (US)

(*) Notice: Subject to any disclaimer, the term of this patent is extended or adjusted under 35 U.S.C. 154(b) by 0 days.

(21) Appl. No.: 15/335,999

(22) Filed: Oct. 27, 2016

(65) Prior Publication Data

US 2018/0122748 A1 May 3, 2018

(51) Int. Cl.
| | | |
|---|---|---|
| *H01L 23/00* | (2006.01) | |
| *H01L 23/66* | (2006.01) | |
| *H01L 23/498* | (2006.01) | |

(52) U.S. Cl.
CPC .......... *H01L 23/562* (2013.01); *H01L 23/498* (2013.01); *H01L 23/66* (2013.01); *H01L 2223/6677* (2013.01)

(58) Field of Classification Search
CPC .............. H01L 23/562; H01L 23/66; H01L 2223/6677; H01L 23/552; H01L 23/12–23/15; H01L 10/265; H01L 2224/1319–2224/13191; H01L 2224/1369–2224/13691; H01L 2224/2919–2224/29191; H01L 2224/2969–2224/29691; H01L 2224/8185–2224/8189
See application file for complete search history.

(56) References Cited

U.S. PATENT DOCUMENTS

| | | | |
|---|---|---|---|
| 6,142,361 A | 11/2000 | Downes, Jr. et al. | |
| 2009/0315156 A1 | 12/2009 | Harper | |
| 2013/0056863 A1* | 3/2013 | Chi | H01L 23/16 257/704 |
| 2013/0270660 A1 | 10/2013 | Bryzek et al. | |
| 2014/0210083 A1 | 7/2014 | Zhao et al. | |
| 2015/0143690 A1* | 5/2015 | Poddar | H01F 41/046 29/606 |
| 2016/0133565 A1* | 5/2016 | Bhatkar | H01L 23/5227 257/531 |
| 2016/0268213 A1 | 9/2016 | Jiang et al. | |

OTHER PUBLICATIONS

International Search Report and Written Opinion dated Jan. 9, 2018 for International Application No. PCT/US2017/052792, 13 pages.

* cited by examiner

*Primary Examiner* — Julio J Maldonado
*Assistant Examiner* — Stanetta Isaac
(74) *Attorney, Agent, or Firm* — Schwabe, Williamson & Wyatt, P.C.

(57) ABSTRACT

Embodiments herein may relate to a package with one or more layers. A silicon die may be coupled with the one or more layers via an adhesive. A package stiffener may also be coupled with the adhesive adjacent to the die. A magnetic thin film may be coupled with the package stiffener. Other embodiments may be described and/or claimed.

13 Claims, 5 Drawing Sheets

US 10,134,690 B2

FLOATING PACKAGE STIFFENER

TECHNICAL FIELD

The present disclosure relates generally to the field of semiconductor packages, and more specifically to the use of stiffeners in conjunction with a package.

BACKGROUND

Generally, a semiconductor package (referred to herein as a "package") may include a stiffener such as a thin metal ring installed on the top of the package. The stiffener may help prevent warpage of the package. In some cases, a floating (that is, ungrounded) stiffener may become a source of radio frequency interference (RFI) when the stiffener resonates at WiFi band frequencies. A resonating stiffener may behave as an antenna that couples with the signals and further propagates the noise to nearby WiFi radio, which may result in an eventual degradation of radio sensitivity.

In legacy packages, the stiffener may be grounded by one or more Solder Resist Openings (SROs) that may include grounding points to shift the resonant frequencies of the stiffener away from WiFi bands. However, implementation of SROs may complicate design and assembly of the package. Additionally, the SROs grounding scheme may restrict flexibility in trace routing, as the spacing between SROs may need to be less than 8 millimeters (mm) in order to effectively lower the RFI level of the stiffener. Furthermore, the adhesive between the package and the stiffener may need to be made electrically conductive by mixing a conductive material such as silver flakes with non-conductive epoxy, thereby increasing the manufacturing cost of the package. The silver flakes may also decrease bonding strength of the adhesive, and cause delamination of the stiffener over a period of time.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
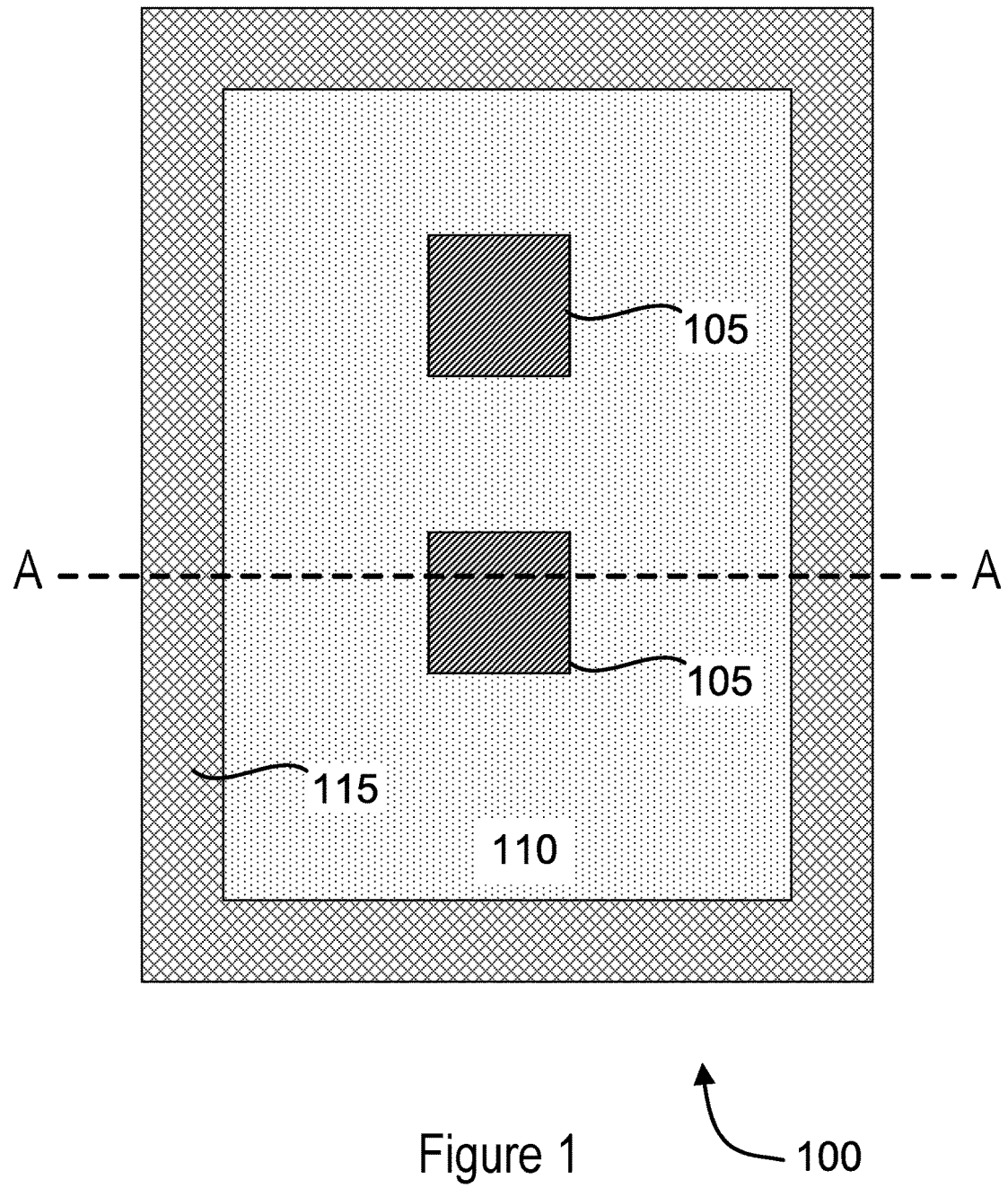
FIG. 1 may depict an example top-down view of a package with a stiffener, in accordance with various embodiments.

Embodiments herein relate to mitigation of the above-described stiffener RFI through placement of a lossy magnetic thin film on top of a floating package stiffener. In some embodiments, the magnetic thin film may have a permeability greater than or equal to approximately 20. In some embodiments, the magnetic thin film may have a magnetic loss tangent of greater than or equal to approximately 0.1. In some embodiments, the magnetic thin film may have a thickness of greater than or equal to approximately 0.5 micrometers (um). Other embodiments may be described and/or claimed.

More generally, embodiments herein may use a lossy magnetic thin film coupled with a stiffener to attenuate noise radiated by the resonating stiffener. In some embodiments the stiffener may be floating. The use of this film may reduce or eliminate noise caused by the resonating stiffener from propagating to the antenna and causing performance degradation.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer" may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

FIG. 1 depicts an example top-down view of a package 100 with a stiffener, in accordance with various embodiments. In some embodiments, the package 100 may include one or more silicon dice 105 coupled with a layer of one or more layers of the package 100. For example, the silicon dice 105 may be coupled with an adhesive layer 110. In some cases the adhesive layer 110 may be a non-conductive adhesive layer such as a non-conductive epoxy that includes a resin and hardener, and/or some other type of non-conductive adhesive layer. The package 100 may also include a stiffener (not shown), which may be a floating, or ungrounded, stiffener. The stiffener may have a layer of a lossy magnetic material 115 disposed thereon, as will be described in further detail below.

A silicon die 105 may be, for example, a die such as a processor, a memory such as a volatile or non-volatile memory, or some other type of die. Although two dice are depicted in FIG. 1, in other embodiments the package 100 may have more or fewer dice than depicted.

Generally, it will be understood that the example depicted in FIG. 1 is intended as an example configuration and other embodiments may have different configurations. For example, although the stiffener and lossy magnetic material 115 are depicted as substantially surrounding the dice 105 at a perimeter of the package 100, in other embodiments the stiffener and the lossy magnetic material 115 may only be positioned on fewer than all of the sides of the package 100. In some embodiments, the stiffener and the lossy magnetic material 115 may not be at the perimeter of the package 100, but instead may be positioned internally to the perimeter of the package 100 such that a portion of the adhesive layer 110 is exposed outside of the perimeter of the stiffener. In some embodiments, one or more layers of the package 100 may be further exposed beyond the perimeter of the stiffener and/or the adhesive layer 110. In some embodiments, the lossy magnetic material 115 may not completely cover the stiffener, but instead may only cover a portion of the stiffener. In some embodiments, the lossy magnetic material 115 may have a lateral area greater than the lateral area of the stiffener such that the lossy magnetic material 115 generally overhangs the stiffener at one or more portions of the stiffener.

Figure 2:
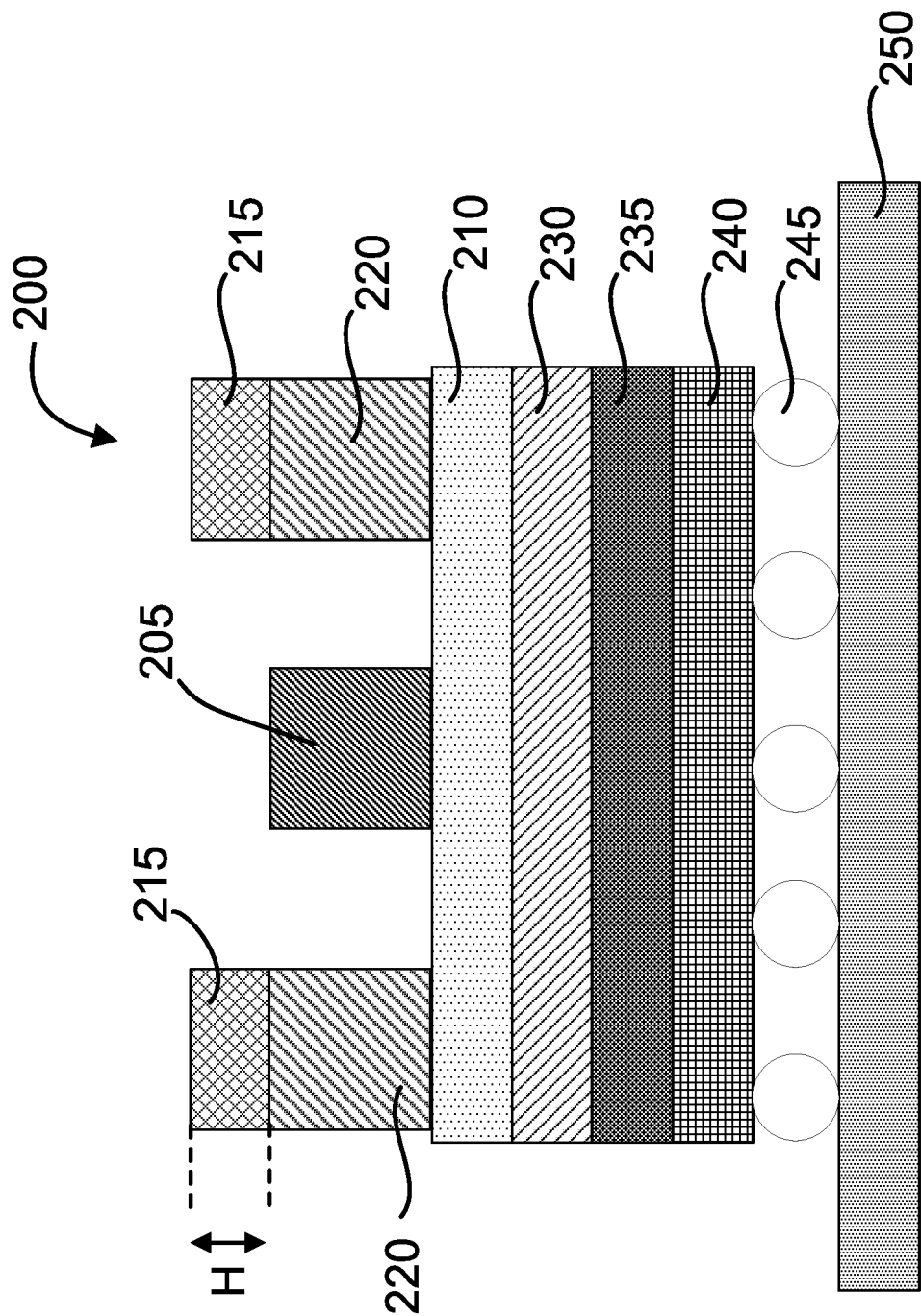
FIG. 2 may depict an example side view of the package of FIG. 1, in accordance with various embodiments.

FIG. 2 depicts an example side view of the package 100 of FIG. 1, in accordance with various embodiments. For example, the package 200 may be a cross-sectional view of package 100 along line A-A as shown in FIG. 1. Elements of FIG. 2 may be numbered similarly to elements of FIG. 1. Specifically, the package 200 may include a lossy magnetic material 215, an adhesive layer 210, and a die 205 which may be respectively similar to lossy magnetic material 115, adhesive layer 110, and die 105.

As shown in FIG. 2, lossy magnetic material 215 may be coupled with a stiffener such as stiffener 220. In embodiments, the stiffener 220 may be composed of steel and/or some other conductive material, metal, and/or alloy. The lossy magnetic material 215 may be disposed on the stiffener 220 through one or more techniques such as lamination, sputtering, and/or some other deposition or placement technique. In some embodiments, the lossy magnetic material 215 may be disposed directly on the stiffener 220, while in other embodiments the lossy magnetic material 215 and the stiffener 220 may be coupled with one another via an adhesive.

Materials, for example the lossy magnetic material 215, have frequency-dependent magnetic properties typically expressed by real and imaginary parts of a characteristic called "permeability." These magnetic properties may be measured, for example, through use of an impedance measuring instrument. The impedance characteristics of a material relate to a material's resistive and inductive properties, which may be converted into real and imaginary parts of permeability. The magnetic loss tangent relates to a ratio of the imaginary part of the permeability to the real part of the permeability, and may describe how much electromagnetic energy can be dissipated by the material.

In embodiments herein, the lossy magnetic material 215 may be composed of a material such as cobalt niobium zirconium (CoNbZr) and/or some other alloy. Generally, the lossy magnetic material 215 may be a material that has a permeability greater than or equal to approximately 20. In some embodiments, the lossy magnetic material 215 may have a magnetic loss tangent of greater than or equal to approximately 0.1. In some embodiments, the magnetic thin film may have a thickness (as indicated by the letter H in FIG. 2) of greater than or equal to approximately 0.5 micrometers (urn). Generally, the permeability and/or the magnetic loss tangent may be measured at frequencies at or near the common frequencies of WiFi signals such as between approximately 2 gigahertz (GHz) and 2.5 GHz.

As noted above, the die 205 and/or the stiffener 220 may be coupled with one or more other layers of the package 200 via the adhesive layer 210. The adhesive layer 210 may be non-conductive, thereby leaving stiffener 220 as a "floating" or electrically un-grounded stiffener. The package 200 may further include one or more layers such as a solder mask layer 230, one or more copper layers 235, and a package ground plane layer 240. In some embodiments, the package 200 may be coupled with a board such as board 250 by way of one or more interconnects such as interconnects 245.

In embodiments, the solder mask layer 230 (which may also be referred to as a solder resist layer) may be to isolate solder lands and tracks of the package 200. Specifically, the solder mask layer 230 may be to protect one or more other elements of the package 200.

The one or more copper layers 235 may include one or more traces and/or conductive elements allowing signals to pass to and from a die such as die 205 and interconnects such as interconnects 245. The copper layers 235 may further include one or more plated through hole (PTH) vias that allow signals to pass vertically between various layers of the package 200. It will be understood that although the layers 235 are referred to as "copper" layers, in other embodiments the layers indicated by 235 may be formed of some other conductive material such as silver, aluminum, nickel, etc.

The ground plane layer 240 may include a conductive material such as a copper foil. In embodiments, the ground plane layer 240 may serve to magnetically and/or electrically isolate traces of the package 200 from one or more traces of the board 250.

The package 200 may be coupled with a board such as board 250 via one or more interconnects 245. In embodiments, the interconnects 245 may be solder joints. In other embodiments, the interconnects 245 may be part of a ball grid array (BGA), a land grid array (LGA) and/or some other type of structure.

The board 250 may be a motherboard of a computing device or some other type of board. In some embodiments, the board 250 may be a patch or an interposer that is positioned between the package 200 and a motherboard of a computing device. In some embodiments, the board may be a printed circuit board (PCB). As indicated above, in some embodiments the board 250 may have one or more pads, vias, and/or traces thereon that may carry signals between interconnects 245 and one or more other components of an electronic device that utilizes the board 250.

In some embodiments, the package 200 may have one or more additional layers which are not be depicted in FIG. 2. For example, the package 200 may have additional copper layers such as copper layer 235, and/or other layers not discussed herein. Generally, unless explicitly stated herein, the various dimensions (e.g., the heights of various layers) depicted in FIG. 2 are intended as non-limiting examples, and other embodiments may have layers that are thicker or thinner.

The package 200 of FIG. 2 may provide one or more advantages over legacy packages. For example, the use of the lossy magnetic material 215 may efficiently mitigate the above-described RFI risk to the package 200. However, the lossy magnetic material 215 may include the further benefit of being relatively easy to implement in that it does not complicate the routing design of the traces and/or other elements of the package 200. The lossy magnetic material 215 may further be relatively cheap compared to legacy package. For example, the use of the lossy magnetic material 215 may allow an adhesive layer such as adhesive layer 210 to be non-conductive, which may be more cost effective than a conductive adhesive layer. Further, the non-conductive adhesive layer 210 may provide better bonding between the stiffener 220 and the remaining layers of the package 200 because the non-conductive adhesive layer may not be required to include a non-adhesive material such as silver or some other conductive material.

Further, the use of the lossy magnetic material 215 may provide flexibility in that it may be adapted to stiffeners of various sizes. It may also be suitable both for a multi chip package (MCP) as well as integration in wearable designs. The lossy magnetic material 215 may also be implementable without requiring the package 200 to have additional length and/or width.

Simulations of embodiments herein have shown a reduction in RFI based on use of a package such as package 200 as compared to a legacy package described above. For example, the package 200 may show an approximately 20 to 30 decibel decrease in RFI at frequencies of approximately 2.5 GHz. The package 200 may further show an approximately 40 decibel decrease in RFI at frequencies of approximately 5.5 GHz.

Figure 3:
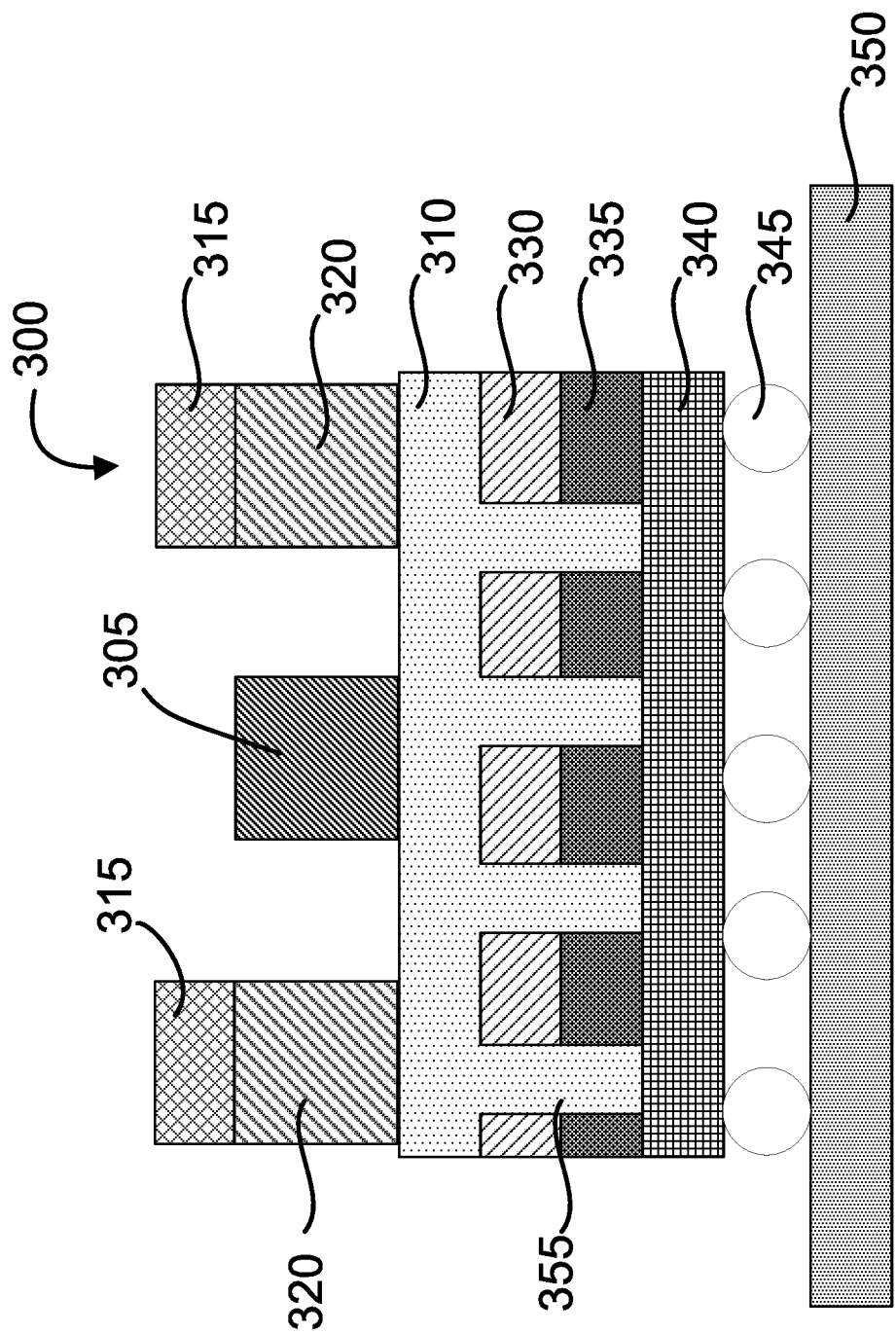
FIG. 3 may depict an alternative example side view of the package of FIG. 1, in accordance with various embodiments.

FIG. 3 depicts an alternative example side view of the package 100 of FIG. 1, in accordance with various embodiments. For example, the package 300 may be a cross-sectional view of package 100 along line A-A as shown in FIG. 1. Elements of FIG. 3 may be numbered similarly to elements of FIG. 1 or 2. Specifically, the package 300 may include a lossy magnetic layer 315, one or more die 305, a stiffener 320, and a ground plane layer 340, which may be respectively similar to lossy magnetic layer 115 or 215, one or more die 105 or 205, stiffener 220, and ground plane layer 240. In some embodiments, the package 300 may be coupled with a board 350, which may be similar to board 250, by way of one or more interconnects 345, which may be similar to interconnects 245.

In some embodiments, the package 300 may further include a conductive adhesive layer 310. As described above, the conductive adhesive layer 310 may include, for example, a conductive material such as silver. The package 300 may further include one or more SROs 355 through a solder mask layer 330 and one or more copper layers 335 which may be respectively similar to solder mask layer 230 and copper layer(s) 235.

In some embodiments, the SROs 355 may be electrically conductive and allow for the stiffener 320 to be electrically coupled with the ground plane layer 340. In this embodiment, the stiffener 320 may not be "floating" or ungrounded. Although only four SROs 355 are depicted in FIG. 3, other embodiments may have more or fewer SROs. Additionally, the widths of the depicted SROs 355 are intended as one example; however, in other embodiments different SROs 355 may have different widths.

Figure 4:
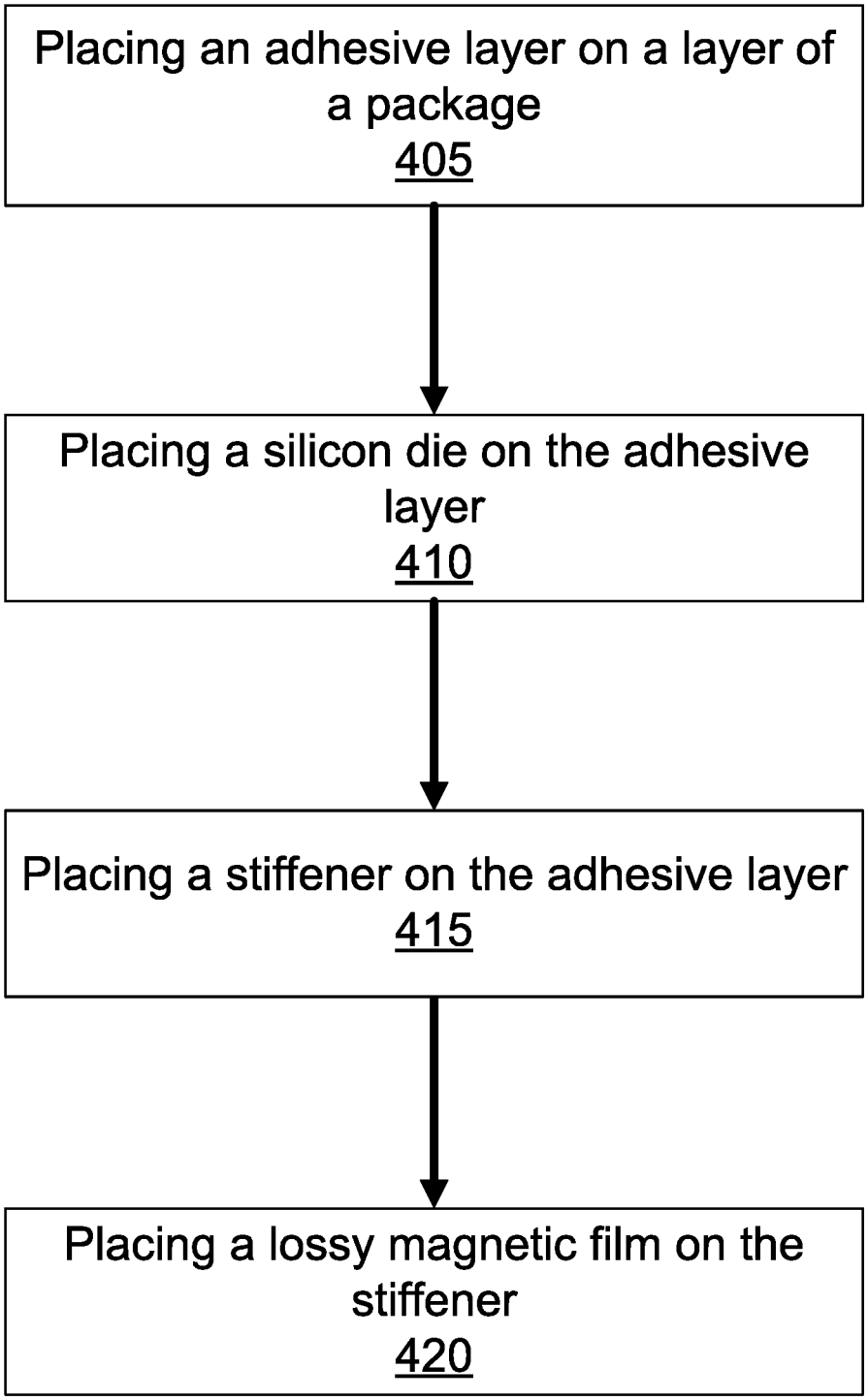
FIG. 4 may depict an example process of making the package of FIG. 1, in accordance with various embodiments.

FIG. 4 depicts an example technique for manufacturing a package such as packages 100, 200, and/or 300. In embodiments, the technique may include placing an adhesive layer on a layer of a package at 405. For example, the adhesive layer may be a non-conductive adhesive layer such as non-conductive adhesive layers 110 or 210. In other embodiments, the adhesive layer may be a conductive adhesive layer such as conductive adhesive layer 310. The adhesive layer may be placed on a layer of a package such as the solder mask layers 230 or 330. In some embodiments, the adhesive layer may be placed on the solder mask layer via lamination, deposition, sputtering, and/or some other technique.

The technique further includes placing a silicon die on the adhesive layer at 410. The silicon die may be a die such as die 105, 205, and/or 305. The die may be placed on the adhesive layer through a die-attach technique such as pick-and-place, and/or some other die-attach technique.

The technique further includes placing a stiffener on the adhesive layer at 415. The stiffener may be a stiffener such as stiffener 220 and/or 320. In embodiments, the stiffener may be placed on the adhesive layer via manual, mechanical, and/or some other means.

It will be understood that although FIG. 4 depicts element 410 occurring prior to element 415, in other embodiments element 415 may occur prior to element 410. In some embodiments where multiple die are placed on the adhesive at 410, element 415 may occur between the placement of two of the multiple die. In some embodiments, elements 410 and 415 may occur simultaneously.

The technique may further include placing a lossy magnetic film on the stiffener at 420. The lossy magnetic film may be a lossy magnetic film such as 115, 215, and/or 315. In some embodiments, element 420 may occur prior to element 415. In some embodiments, element 420 may occur subsequent to element 415 as shown in FIG. 4. As noted above, placement of the lossy magnetic film on the stiffener may occur through a process such as deposition, sputtering, lamination, and/or some other placement technique.

Figure 5:
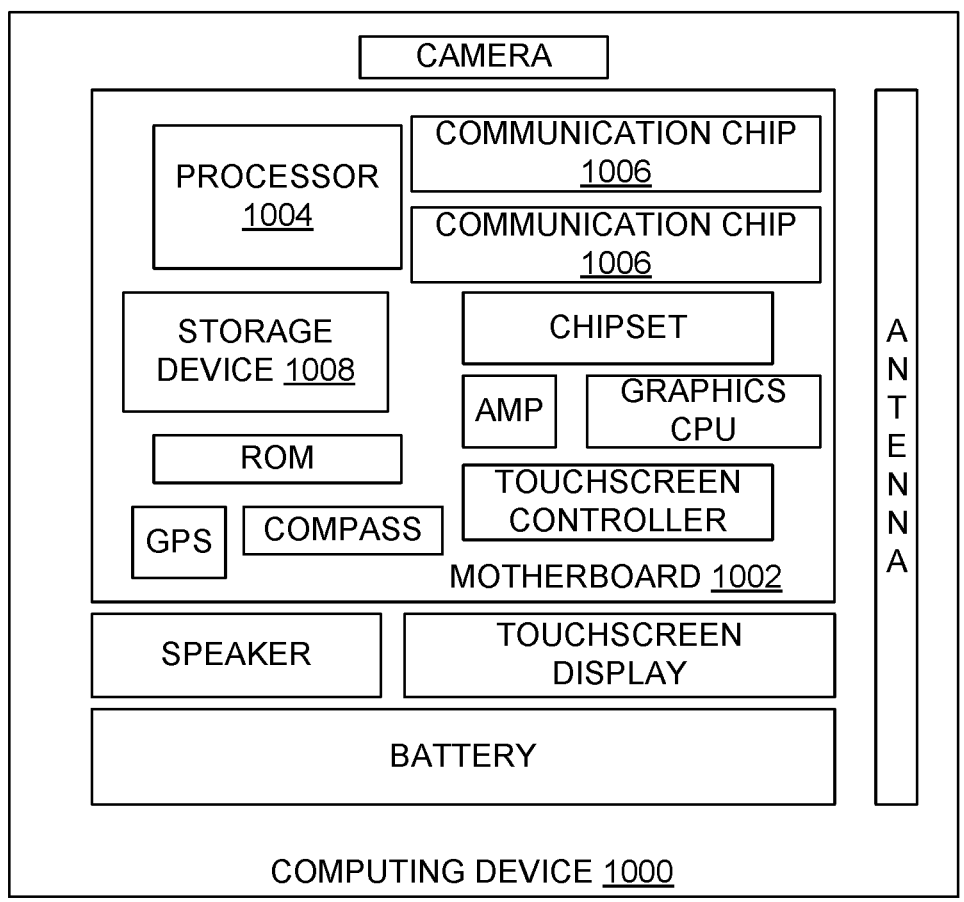
FIG. 5 depict an example computing device that may include one or more anchoring pins, in accordance with various embodiments.

Embodiments of the present disclosure may be implemented into a system using any packages that may benefit from the various manufacturing techniques disclosed herein. FIG. 5 schematically illustrates a computing device 1000, in accordance with some implementations, which may include one or more packages such as packages 100, 200, 300, etc. For example, various elements such as processor 1004, communication chip 1006, and/or some other component of the computing device 1000 may be implemented as a die of one of packages 100, 200, 300, etc. The board 250 or 350 may be implemented as motherboard 1002. One or more of the components of the computing device 1000 may be coupled with the motherboard 1002 via one or more anchoring pins as described above.

The computing device 1000 may be, for example, a mobile communication device or a desktop or rack-based computing device. The computing device 1000 may house a board such as a motherboard 1002. The motherboard 1002 may include a number of components, including (but not limited to) a processor 1004 and at least one communication chip 1006. Any of the components discussed herein with reference to the computing device 1000 may be arranged in or coupled with a package such as discussed herein. In further implementations, the communication chip 1006 may be part of the processor 1004.

The computing device 1000 may include a storage device 1008. In some embodiments, the storage device 1008 may include one or more solid state drives. Examples of storage devices that may be included in the storage device 1008 include volatile memory (e.g., dynamic random access memory (DRAM)), non-volatile memory (e.g., read-only memory, ROM), flash memory, and mass storage devices (such as hard disk drives, compact discs (CDs), digital versatile discs (DVDs), and so forth).

Depending on its applications, the computing device 1000 may include other components that may or may not be physically and electrically coupled to the motherboard 1002. These other components may include, but are not limited to, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

The communication chip 1006 and the antenna may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wide region (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1006 may operate in accordance with a Global System for Mobile Communications (GSM), General Packet Radio Service (GPRS), Universal Mobile Telecommunications System (UMTS), High Speed Packet Access (HSPA), Evolved HSPA (E-HSPA), or LTE network. The communication chip 1006 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1006 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1006 may operate in accordance with other wireless protocols in other embodiments.

The computing device 1000 may include a plurality of communication chips 1006. For instance, a first communication chip 1006 may be dedicated to shorter range wireless communications such as Wi-Fi and Bluetooth, and a second communication chip 1006 may be dedicated to longer range wireless communications such as GPS, EDGE, GPRS, CDMA, WiMAX, LTE, EV-DO, and others. In some embodiments, the communication chip 1006 may support wired communications. For example, the computing device 1000 may include one or more wired servers.

The processor 1004 and/or the communication chip 1006 of the computing device 1000 may include one or more dies or other components in an IC package. Such an IC package may be coupled with an interposer or another package using any of the techniques disclosed herein. The term "processor" may refer to any device or portion of a device that processes electronic data from registers and/or memory to transform that electronic data into other electronic data that may be stored in registers and/or memory.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data. In some embodiments, the recessed conductive contacts disclosed herein may be implemented in a high-performance computing device.

The following paragraphs provide examples of various ones of the embodiments disclosed herein.

Example 1 may include a package comprising: one or more layers; a silicon die coupled with the one or more layers via an adhesive; a package stiffener adjacent to the die and coupled with the adhesive on a first side of the package stiffener; and a magnetic thin film coupled with the package stiffener on a second side of the package stiffener opposite the first side.

Example 2 may include the package of example 1, wherein the adhesive is non-conductive.

Example 3 may include the package of example 1, wherein the adhesive is conductive.

Example 4 may include the package of example 3, wherein the silicon die is electrically coupled with one of the one or more layers.

Example 5 may include the package of any of examples 1-3, wherein the magnetic thin film has a permeability greater than or equal to 20.

Example 6 may include the package of any of examples 1-3, wherein the magnetic thin film has a magnetic loss tangent of greater than or equal to 0.1.

Example 7 may include the package of any of examples 1-3, wherein the magnetic thin film has a thickness as measured in a direction perpendicular to the second side of the package stiffener of greater than or equal to 0.5 micrometers (um).

Example 8 may include the package of any of examples 1-3, wherein the package stiffener surrounds the silicon die in a plane parallel to the first side of the package stiffener.

Example 9 may include the package of any of examples 1-3, wherein the magnetic thin film includes cobalt niobium zirconium (CoNbZr).

Example 10 may include an electronic device package comprising: a motherboard; and a package coupled with the motherboard at a first side of the package, wherein the package further includes: a die coupled with the package via an adhesive layer on a second side of the package opposite the first side; a stiffener with a first side coupled with the adhesive layer adjacent to the die; and a magnetic thin film coupled with the stiffener at a second side of the stiffener opposite the first side of the stiffener.

Example 11 may include the electronic device of example 10, wherein the adhesive is non-conductive.

Example 12 may include the electronic device of examples 10 or 11, wherein the magnetic thin film has a permeability greater than or equal to 20.

Example 13 may include the electronic device of examples 10 or 11, wherein the magnetic thin film has a magnetic loss tangent of greater than or equal to 0.1.

Example 14 may include the electronic device of examples 10 or 11, wherein the magnetic thin film has a thickness as measured in a direction perpendicular to the second side of the stiffener of greater than or equal to 0.5 micrometers (um).

Example 15 may include the electronic device of examples 10 or 11, wherein the magnetic thin film includes cobalt niobium zirconium (CoNbZr).

Example 16 may include a method comprising: placing an adhesive layer on a layer of a package; placing a silicon die on the adhesive layer; placing a stiffener on the adhesive layer wherein subsequent to the placing of the silicon die and the placing of the stiffener, the stiffener and the silicon die are adjacent to one another; and placing a magnetic thin film on the stiffener such that the stiffener is between the adhesive layer and the magnetic thin film.

Example 17 may include the method of example 16, wherein the adhesive is non-conductive.

Example 18 may include the method of examples 16 or 17, wherein the magnetic thin film has a permeability greater than or equal to 20 and a magnetic loss tangent of great than or equal to 0.1.

Example 19 may include the method of examples 16 or 17, wherein the magnetic thin film has a thickness as measured in a direction perpendicular to a second side of the stiffener of greater than or equal to 0.5 micrometers (um).

Example 20 may include the method of examples 16 or 17, wherein the magnetic thin film includes cobalt niobium zirconium (CoNbZr).

What is claimed is:

1. A package comprising:
   one or more layers;
   a silicon die coupled with the one or more layers via an adhesive;
   a package stiffener adjacent to the die and coupled with the adhesive on a first side of the package stiffener; and
   a magnetic thin film coupled with the package stiffener on a second side of the package stiffener opposite the first side;
   wherein the magnetic thin film has a magnetic loss tangent of greater than or equal to 0.1.

2. The package of claim 1, wherein the adhesive is non-conductive.

3. The package of claim 1, wherein the adhesive is conductive.

4. The package of claim 3, wherein the silicon die is electrically coupled with one of the one or more layers.

5. The package of claim 1, wherein the magnetic thin film has a permeability greater than or equal to 20.

6. The package of claim 1, wherein the magnetic thin film has a thickness as measured in a direction perpendicular to the second side of the package stiffener of greater than or equal to 0.5 micrometers (um).

7. The package of claim 1, wherein the package stiffener surrounds the silicon die in a plane parallel to the first side of the package stiffener.

8. The package of claim 1, wherein the magnetic thin film includes cobalt niobium zirconium (CoNbZr).

9. An electronic device comprising:
   a motherboard; and
   a package coupled with the motherboard at a first side of the package, wherein the package further includes:
      a die coupled with the package via an adhesive layer on a second side of the package opposite the first side;
      a stiffener with a first side coupled with the adhesive layer adjacent to the die; and
      a magnetic thin film coupled with the stiffener at a second side of the stiffener opposite the first side of the stiffener;
      wherein the magnetic thin film has a magnetic loss tangent of greater than or equal to 0.1.

10. The electronic device of claim 9, wherein the adhesive layer is non-conductive.

11. The electronic device of claim 9, wherein the magnetic thin film has a permeability greater than or equal to 20.

12. The electronic device of claim 9, wherein the magnetic thin film has a thickness as measured in a direction perpendicular to the second side of the stiffener of greater than or equal to 0.5 micrometers (um).

13. The electronic device of claim 9, wherein the magnetic thin film includes cobalt niobium zirconium (CoNbZr).

* * * * *